(12) United States Patent
Hinterscher

(10) Patent No.: US 6,975,153 B2
(45) Date of Patent: Dec. 13, 2005

(54) LOW POWER INPUT WITH HYSTERESIS CIRCUIT AND METHODS THEREFOR

(75) Inventor: Gene B. Hinterscher, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/780,982

(22) Filed: Feb. 18, 2004

(65) Prior Publication Data

US 2005/0093602 A1    May 5, 2005

Related U.S. Application Data

(60) Provisional application No. 60/517,366, filed on Nov. 5, 2003.

(51) Int. Cl.[7] .......................... H03K 3/12; H03K 3/037; H03K 3/286; H03K 3/356
(52) U.S. Cl. ...................................... 327/206; 327/112
(58) Field of Search .......................... 327/112, 205–206

(56) References Cited

U.S. PATENT DOCUMENTS 5,767,728 A * 6/1998 Michail et al. ............. 327/374
6,801,073 B2 * 10/2004 Morgan ..................... 327/290

FOREIGN PATENT DOCUMENTS

JP         01010718 A  *  1/1989  ........... H01L 27/08
JP         2000332580 A  * 11/2000  ........... H03K 3/027

* cited by examiner

Primary Examiner—Quan Tra
(74) Attorney, Agent, or Firm—J. Dennis Moore; W. James Brady, III; Frederick J. Telecky, Jr.

(57) ABSTRACT

A low power input with hysteresis circuit provides input hysteresis (for instance, from supply voltage ranges of 0.8 volt to 5.5 volts), while reducing the high-current region and the overall power consumption of an electronic device. The present invention utiliizes resistors and feedback transistors to limit the "through current" of the device when it is switching, and to provide extra hysteresis to the input circuit. The hysteresis can be adjusted by altering the resistance of the resistors. The present invention provides a very large hysteresis, or may be slightly modified to supply very little hystersis while having little effect on propagation delays, as compared with conventional input circuits with similar hysteresis. Accordingly, the present invention reduces the high-current region and the power consumption of the device while providing the required hystersis on the input.

20 Claims, 2 Drawing Sheets

LOW POWER INPUT WITH HYSTERESIS CIRCUIT AND METHODS THEREFOR

RELATED PATENT APPLICATIONS

This application claims the benefit, under 35 U.S.C. §119 (e) (1), of U.S. Provisional Application 60/517,366, entitled LOW POWER INPUT WITH HYSTERESIS CIRCUIT AND METHODS, filed Nov. 5, 2003, by Gene B. Hinterscher.

FIELD OF THE INVENTION

The present invention generally relates to the field of electronic circuits, and more specifically to hysteresis circuits.

BACKGROUND OF THE INVENTION

Sometimes, it is indeed desirable to have hysteresis (for example, in a reset circuit). Hysteresis is also useful in avoiding false switching (with noisy or slowly changing signals). Accordingly, several types of hysteresis circuits have been designed and constructed so far.

A disadvantage of using conventional hysteresis circuits lies in that several resistors are needed during the operation of the conventional hysteresis circuits. Accordingly, utilizing a low supply voltage is not practical.

However, it is preferred that the hysteresis circuits function at low power supply voltages and low power consumption. In this way, hysteresis circuits can be made useful in the case of small, portable electronic equipment.

Referring now more specifically to CMOS devices, in certain scenarios, a high-current region exists when CMOS devices are switching (i.e., "through current"). Accordingly, using a conventional hysteresis circuit is not advisable.

Therefore, a need exists to overcome the problems with the prior art as discussed above.

SUMMARY OF THE INVENTION

Thus, what is needed is a solution that provides input hysteresis at a low supply voltage (e.g., a supply voltage range of 0.8 to 5.5 volts), while reducing the high-current region and the overall power consumption of the device.

According to one aspect of the present invention, the hysteresis circuit contains five CMOS transistors of a first type. It also contains another five (sixth, seventh, eighth, ninth and tenth) CMOS transistors of a type complementary to the first five CMOS transistors. An input terminal is coupled to gates of the first, second, sixth and seventh CMOS transistors for applying an input signal. An output terminal is coupled with gates of the fourth and ninth CMOS transistors, and with drains of the fifth and tenth CMOS transistors for generating an output signal. A first resistor is coupled with sources of the seventh and ninth CMOS transistors. The source of the seventh CMOS transistor is connected to drain of the ninth CMOS transistor.

Further, a second resistor is coupled with sources of the second and fourth CMOS transistors and to ground, and drain of the fourth CMOS transistor is connected to source of the second CMOS transistor. The drain of the second CMOS transistor is connected to sources of the first and third CMOS transistors. The gates of the third, fifth, eighth and tenth CMOS transistors are interconnected, and are connected to drains of first and sixth transistors.

The sources of the seventh and eighth CMOS transistors are interconnected, and drain of the eighth CMOS transistor and source of the fifth CMOS transistor are connected to ground.

According to another aspect of the present invention, hysteresis is generated while decreasing high-current region and power consumption of an electronic device. The method includes limiting the "through current" of the device when the device is switching with the aid of resistors and feedback transistors. The method further includes adjusting the hysteresis by altering the resistance of the resistors.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings wherein:

FIG. 1A is a schematic diagram illustrating a low power input with hysteresis circuit (for large hysteresis), while

Figure 1A:
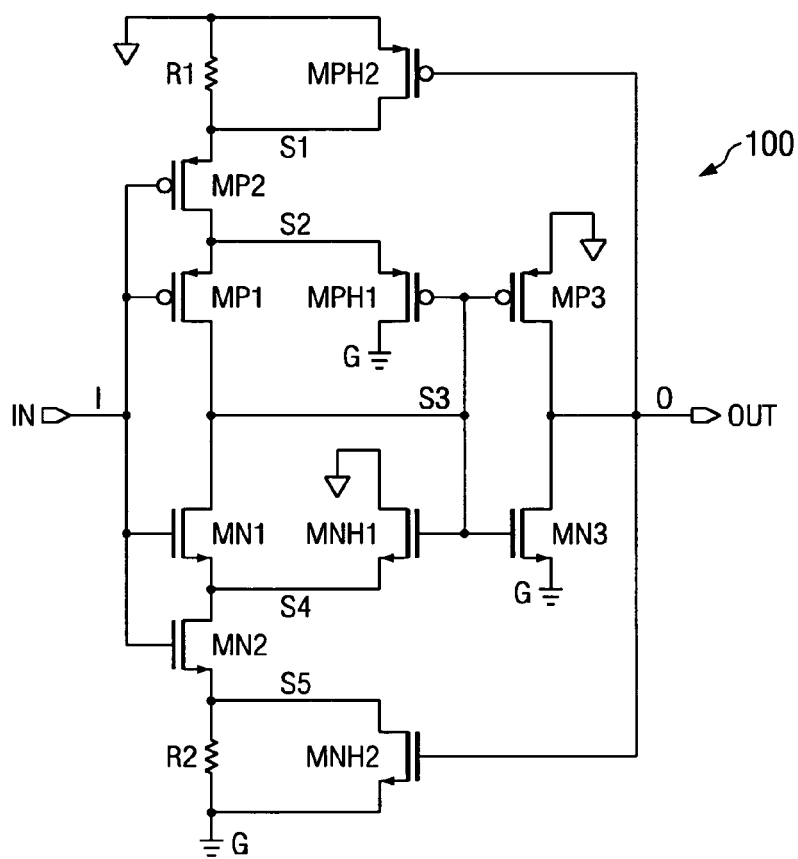

While the above-identified drawing figures set forth particular embodiments, other embodiments of the present invention are also contemplated, as noted in the description. In all cases, the disclosure presents illustrated embodiments of the present invention by way of representation and not limitation. Numerous other modifications and embodiments can be devised by those skilled in the art which fall within the scope and spirit of the principles of the present invention.

DETAILED DESCRIPTION

The present invention, according to one embodiment, overcomes problems with the prior art by providing the required hystersis on the input—while reducing the high-current region and the overall power consumption of a device. The present invention can provide a very large hysteresis, or can be slightly modified to supply very little hystersis, while reducing the "input through current" and the overall power consumption—while having very little impact on propagation delays, as compared with conventional input circuits with similar hysteresis.

The present invention is suitable for implementation in the successor generations of AUP devices, and in any family of devices where battery life and low power consumption are critical. The AUP family is an ultra low power family of devices, best suited for applications where battery life and low power consumption are critical. For example, the present invention provides input hysteresis from supply voltage ranges of 0.8 volts to 5.5 volts, while decreasing the high-current region and the power consumption of the device.

Reference throughout the specification to "one embodiment" means that a particular feature, structure, or characteristic described in connection with the embodiment is included in at least one embodiment of the present invention. Thus, the appearances of the phrases "in one embodiment" in various places throughout the specification are not necessarily all referring to the same embodiment. Furthermore, the particular features, structures, or characteristics may be combined in any suitable manner in one or more embodiments. Moreover, these embodiments are only examples of the many advantageous uses of the innovative teachings herein. In general, statements made in the specification of the present application do not necessarily limit any of the various claimed inventions. Moreover, some statements may apply to some inventive features, but not to others. In general, unless otherwise indicated, singular elements may be in the plural and vice versa with no loss of generality.

The scope of the present invention in its many embodiments is defined in the appended claims. Nonetheless, the invention and its many features may be more fully appreciated in the context of exemplary implementations disclosed and described herein which combine one or more embodiments of the invention with other concepts, architectures, circuits, and structures to achieve better results than previously achievable.

Implementation Embodiments

The present invention, according to one embodiment, provides input hysteresis from supply voltage ranges of 0.8 to 5.5 volts, while reducing the high-current region and the power consumption of the device.

Accordingly, the present invention utilizes resistors and feedback transistors to limit the "through current" of a device when the device is switching, and also to provide extra hysteresis to the input circuit. The hysteresis is adjusted by increasing or decreasing the values of the resistors.

Figure 1B:
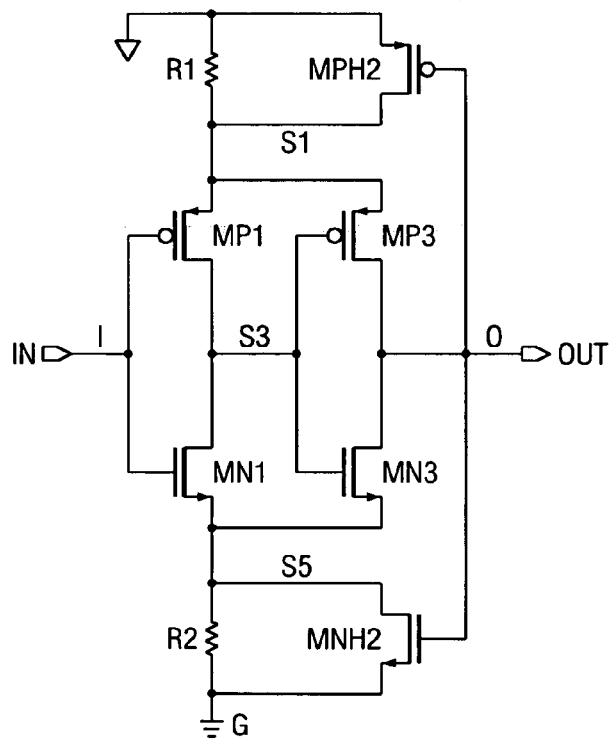
FIG. 1B is a slightly modified version of FIG. 1A (for smaller hysteresis), according to the present invention.

Referring now to the drawings, FIGS. 1A–1B show the low power input with hysteresis circuit 100. FIG. 1A shows a configuration with large hysteresis, while FIG. 1B is a slightly modified version of FIG. 1A (for smaller hysteresis).

According to one aspect of the present invention, the hysteresis circuit 100 contains five CMOS transistors (MN1–MN2, MNH1–MNH2, MN3) of a first type. The circuit 100 also contains another five (sixth, seventh, eighth, ninth and tenth) CMOS transistors (MP1–MP2, MPH1–MPH2, MP3) of a type complementary to the first five CMOS transistors. An input terminal I is coupled to gates of the first (MN1), second (MN2), sixth (MP1) and seventh (MP2) CMOS transistors for applying an input signal (in). An output terminal O is coupled with gates of the fourth (MNH2) and ninth (MPH2) CMOS transistors, and with drains of the fifth and tenth CMOS transistors (MN3, MP3) for generating an output signal (out). A first resistor R1 is coupled with sources of the seventh and ninth CMOS transistors (MP2, MPH2). The source of the seventh CMOS transistor MP2 is connected to drain of the ninth CMOS transistor MPH2 (at node s1).

Further, a second resistor R2 is coupled with sources of the second and fourth CMOS transistors (MN2, MNH2) and to ground G, and drain of the fourth CMOS transistor MNH2 is connected to source of the second CMOS transistor MN2 at node s5. The drain of the second CMOS transistor MN2 is connected to sources of the first (MN1) and third (MNH1) CMOS transistors (at node s4). The gates of the third, fifth, eighth and tenth CMOS transistors (MNH1, MN3, MPH1, MP3) are interconnected, and are connected to drains of first and sixth transistors (MN1, MP1) (at node s3).

The sources of the seventh and eighth CMOS transistors (MP2, MPH1) are interconnected (at node s2), and drain of the eighth CMOS transistor MPH1 and source of the fifth CMOS transistor MN3 are connected to ground G.

In an embodiment, the first resistor R1 is linearly variable. In another embodiment, the first resistor R1 is non-linearly variable.

In one embodiment, the second resistor R2 is linearly variable. In a further embodiment, the second resistor R2 is non-linearly variable.

Operation

Figure 2:
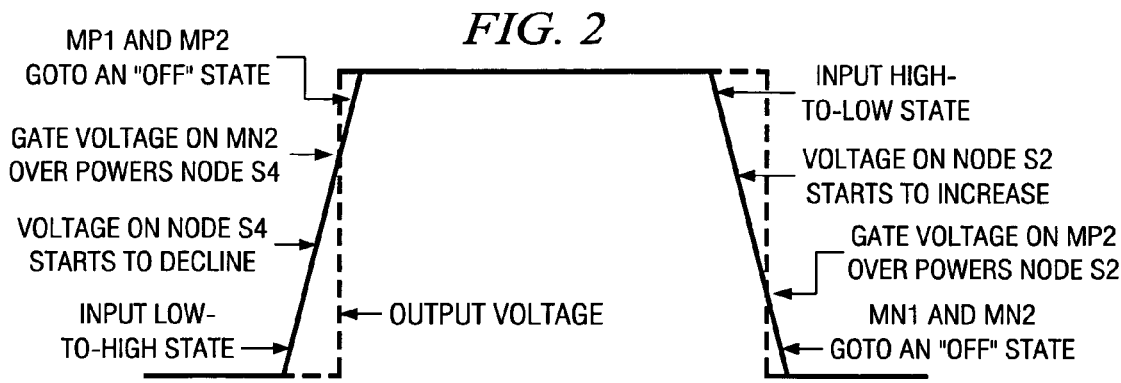
FIG. 2 is a diagram illustrating the operation of the hysteresis circuit of FIG. 1A, according to the present invention.

The operation of the hysteresis circuit of the present invention will now be described using the graph of FIG. 2. Referring now specifically to the hysteresis circuit 100 of FIG. 1A, when the input signal (in) is at a low voltage, the N-channel transistors MN1 and MN2 are in an "off" state. The P-channel transistors MP1 and MP2 are in an "on" state, and supply a high voltage to node S3. The high voltage at the node S3 holds the P-channel transistor MPH1 in an "off" state, the N-channel transistor MNH1 in an "on" state, and supplies a weak high voltage to the node S4. Consequently, the P-channel transistor MP3 is in an "off" state, and the N-channel transistor MN3 is in an "on" state, which holds the P-channel transistor MPH2 in an "on" state and the N-channel transistor MNH2 in an "off" state. This imparts the resistor R2 the function of a current limiting resistor.

As the input (in) is ramped up from the low-to-high voltage, the transistor MN2 turns "on", and the voltage on the node S4 starts to decline until the transistor MN1 is turned "on". This pulls down the node S3, which turns "off" the transistor MNH1. Additionally, the node S3, transitioning to a LOW state, turns the transistor MN3 "off" and the transistor MP3 "on". This places a HIGH state on the gate of the transistor MNH2, which effectively "shorts out" the resistor R2 and eliminates the "current limiting" function. As the input voltage (in) approaches its HIGH state, the transistors MP1 and MP2 withdraw to an "off" state, and the transistor MPH1 turns "on" —preparing itself for the high-to-low transition. FIG. 2 specifically illustrates the low-to-high input voltage transition.

When the input signal (in) is at a high voltage, the P-channel transistors MP1 and MP2 are in an "off" state. The N-channel transistors MN1 and MN2 are in an "on" state and supply a low voltage to node S3. The low voltage at the node S3 holds the N-channel transistor MNH1 in an "off" state and the P-channel transistor MPH1 in an "on" state, and supplies a weak low voltage to the node S2. The transistor MN3 is in an "off" state and the transistor MP3 is in an "on" state. This holds the transistor MNH2 in an "on" state and the transistor MPH2 in an "off" state, and imparts the resistor R1 the function of a current limiting resistor.

As the input voltage (in) is ramped down from the high-to-low voltage, the transistor MP2 is turned "on". Further, the voltage on the node S2 starts to increase until the transistor MP1 turns "on". This pulls up the node S3, which then turns off the transistor MPH1. Additionally, the node S3, transitioning to a HIGH state, turns the transistor MP3 "off" and the transistor MN3 "on". This places a LOW state on the gate of the transistor MPH2, "shorts out" the resistor R1, and eliminates the "current limiting" function. As the input voltage (in) approaches its LOW state, the transistors MN1 and MN2 withdraw to an "off" state, and the transistor MNH1 turns "on", preparing itself for the low-to-high transition. Accordingly, "hysteresis" is realized, as illustrated in FIG. 2.

If the input signal (in) is noisy, the values of the resistors R1, R2 can be altered to increase the hysteresis.

Results Comparison

Figure 3:
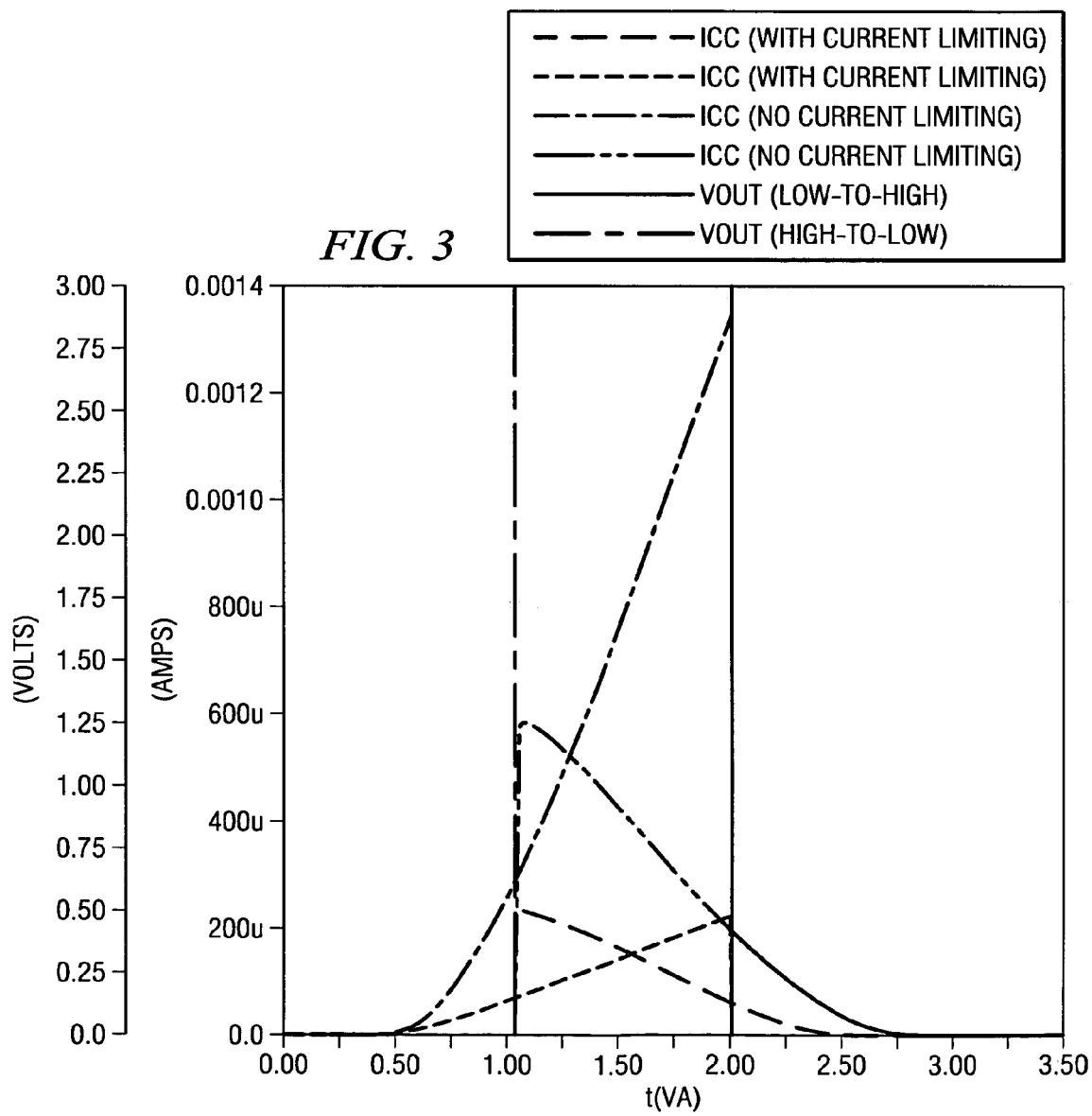
FIG. 3 is a graph illustrating current of the circuit of FIG. 1A, versus current of a conventional circuit having similar hysteresis and component sizes.

Turning now to FIG. 3, shown therein is the current comparison plot of the low power input with hysteresis circuit 100, versus a conventional circuit having similar hysteresis and component sizes. The solid sloped lines represent the hysteresis switching currents for the low power input circuit. The dashed sloped lines represent the hysteresis switching currents for the conventional hysteresis circuit.

FIG. 1B shows another embodiment of the invention. FIG. 1B is a slightly modified version of FIG. 1A for providing smaller hysteresis. Hysterisis circuit 100 in FIG. 1B is identical to the circuit of FIG. 1A with the exceptions that transistors MP2, MPH1, MN2, and MNH1 are eliminated, the source of transistor MP3 is connected to node S1, and the source of transistor MN3 is connected to node S5. Hysterisis circuit 100 of FIG. 1B operates as follows. When the input signal (in) is at a low voltage, the N-channel transistor MN1 is in an "off" state. The P-channel transistor MP1 is in an "on" state, and supplies a high voltage to node S3. Consequently, the P-channel transistor MP3 is in an "off" state, and the N-channel transistor MN3 is in an "on" state, which holds the P-channel transistor MPH2 in an "on" state and the N-channel transistor MNH2 in an "off" state. This imparts the resistor R2 the function of a current limiting resistor.

As the input (in) is ramped up from the low-to-high voltage, transistor MN1 is turned "on". This pulls down the node S3, which turns the transistor MN3 "off" and the transistor MP3 "on". This places a HIGH state on the gate of the transistor MNH2, which effectively "shorts out" the resistor R2 and eliminates the "current limiting" function. As the input voltage (in) approaches its HIGH state, the transistor MP1 withdraws to an "off" state.

When the input signal (in) is at a high voltage, the P-channel transistor MP1 is in an "off" state. The N-channel transistor MN1 is in an "on" state and supplies a low voltage to node S3. As a result of the low voltage at the node S3, the transistor MN3 is in an "off" state and the transistor MP3 is in an "on" state. This holds the transistor MNH2 in an "on" state and the transistor MPH2 in an "off" state, and imparts the resistor R1 the function of a current limiting resistor.

As the input voltage (in) is ramped down from the high-to-low voltage, the transistor MP1 is turned "on". This pulls up the node S3, which turns the transistor MP3 "off" and the transistor MN3 "on". This places a LOW state on the gate of the transistor MPH2, "shorts out" the resistor R1, and eliminates the "current limiting" function. As the input voltage (in) approaches its LOW state, the transistor MN1 withdraws to an "off" state. Accordingly, "hysteresis" is realized.

In addition, in other embodiments, the circuit 100 of the present invention is coupled with a non-illustrated circuit substrate so as to form an integrated circuit.

For example, the integrated circuit may be of the Application Specific Integrated Circuit (ASIC) variety where at least a portion of the circuitry for integrated circuit is defined through a Hardware Development Language (HDL) such as Verilog or VHDL. HDL may be utilized to specify an arrangement of standard logic cell types through one or more macros to define a desired logical structure.

Thus, advantageously, the present invention reduces the high-current region and the overall power consumption of a device while providing the required hysteresis on the input. The present invention can provide a very large hysteresis, or can be slightly modified to supply very little hystersis, while reducing the "input through current" and the overall power consumption—while having very little impact on propagation delays, as compared with input circuits with similar hysteresis. The present invention can be implemented in the successor generations of AUP devices, and in any family of devices where battery life and low power consumption are critical.

Non-Limiting Embodiments

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

In view of the above, it can be seen that the present invention presents a significant advancement in the art of hysteresis circuit technology. Further, the present invention has been described in considerable detail in order to provide those skilled in the art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, although various embodiments have been presented herein with reference to particular transistor types, the present inventive structures and characteristics are not necessarily limited to particular transistor types or sets of characteristics as used herein. It shall be understood that the embodiments described herein above can easily be implemented using many diverse transistor types according to the inventive principles set forth herein above.

Although the present invention has been described in detail with reference to certain versions thereof, other versions are possible. Some components are shown directly connected to one another while others are shown connected through intermediate components. In each instance, the method of interconnection establishes some electrical communication between two or more circuit nodes. Such communication and logic functions of the circuits may often be accomplished using a plurality of configurations, as will be understood by those of ordinary skill in the art. Therefore, the spirit and scope of the appended claims should not be limited to the description of the versions illustrated in the figures.

What is claimed is:

1. A hysteresis circuit, comprising:
   first, second, third, fourth and fifth CMOS transistors;
   sixth, seventh, eighth, ninth and tenth CMOS transistors of a type complementary to the first five CMOS transistors;
   an input terminal coupled to gates of said first, second, sixth and seventh CMOS transistors for applying an input signal;
   an output terminal coupled with gates of said fourth and ninth CMOS transistors, and with drains of said fifth and tenth CMOS transistors for generating an output signal;
   a first resistor coupled with sources of said seventh and ninth CMOS transistors, and source of said seventh CMOS transistor being connected to drain of said ninth CMOS transistor;

a second resistor coupled with sources of said second and fourth CMOS transistors and to ground, and drain of said fourth CMOS transistor being connected to source of said second CMOS transistor;

drain of said second CMOS transistor being connected to sources of said first and third CMOS transistors;

gates of said third, fifth, eighth and tenth CMOS transistors being interconnected, and being connected to drains of said first and sixth CMOS transistors; and sources of said sixth and eighth CMOS transistors being interconnected, and drain of said eighth CMOS transistor and source of said fifth CMOS transistor being connected to ground.

2. The hysteresis circuit according to claim 1, wherein said first, second, third, fourth and fifth CMOS transistors are N-channel transistors.

3. The hysteresis circuit according to claim 1, wherein said sixth, seventh, eighth, ninth and tenth CMOS transistors are P-channel transistors.

4. The hysteresis circuit according to claim 1, wherein said first resistor is variable.

5. The hysteresis circuit according to claim 4, wherein said first resistor is linearly variable.

6. The hysteresis circuit according to claim 4, wherein said first resistor is non-linearly variable.

7. The hysteresis circuit according to claim 1, wherein said second resistor is variable.

8. The hysteresis circuit according to claim 7, wherein said second resistor is linearly variable.

9. The hysteresis circuit according to claim 7, wherein said second resistor is non-linearly variable.

10. The hysteresis circuit according to claim 1, wherein said fourth and ninth CMOS transistors are feedback transistors.

11. The hysteresis circuit according to claim 1, wherein said input terminal is at a low voltage level.

12. The hysteresis circuit according to claim 1, wherein said input terminal is at a high voltage level.

13. An integrated hysteresis circuit, comprising:

a substrate containing first, second, third, fourth and fifth CMOS transistors thereon;

sixth, seventh, eighth, ninth and tenth CMOS transistors of a type complementary to the first five CMOS transistors;

an input terminal coupled to gates of said first, second, sixth and seventh CMOS transistors for applying an input signal;

an output terminal coupled with gates of said fourth and ninth CMOS transistors, and with drains of said fifth and tenth CMOS transistors for generating an output signal;

a first resistor coupled with sources of said seventh and ninth CMOS transistors, and source of said seventh CMOS transistor being connected to drain of said ninth CMOS transistor;

a second resistor coupled with sources of said second and fourth CMOS transistors and to ground, and drain of said fourth CMOS transistor being connected to source of said second CMOS transistor;

drain of said second CMOS transistor being connected to sources of said first and third CMOS transistors;

gates of said third, fifth, eighth and tenth CMOS transistors being interconnected, and being connected to drains of said first and sixth CMOS transistors; and sources of said seventh and eighth CMOS transistors being interconnected, and drain of said eighth CMOS transistor and source of said fifth CMOS transistor being connected to ground.

14. The integrated hysteresis circuit according to claim 13, wherein said first, second, third, fourth and fifth CMOS transistors are N-channel transistors.

15. The integrated hysteresis circuit according to claim 13, wherein said sixth, seventh, eighth, ninth and tenth CMOS transistors are P-channel transistors.

16. The integrated hysteresis circuit according to claim 13, wherein said first resistor is variable.

17. The integrated hysteresis circuit according to claim 13, wherein said second resistor is variable.

18. A hysteresis circuit, comprising:

first, second, and third CMOS transistors;

fourth, fifth, and sixth CMOS transistors of a type complementary to the first, second, and third CMOS transistors;

an input terminal coupled to gates of said first and fourth CMOS transistors for applying an input signal;

an output terminal coupled with gates of said second and fifth CMOS transistors, and with drains of said third and sixth CMOS transistors for generating an output signal;

a first resistor coupled across a source and drain of said second transistor, and sources of said first and third CMOS transistors being coupled to a drain of said second CMOS transistor;

a second resistor coupled across a source and drain of said fifth CMOS transistor, and sources of said fourth and sixth CMOS transistor being coupled to a drain of said fifth CMOS transistor;

gates of said third and sixth CMOS transistors being interconnected, and being connected to drains of said first and fourth CMOS transistors.

19. The hysteresis circuit according to claim 18, wherein said first, second, and third CMOS transistors are N-channel transistors.

20. The hysteresis circuit according to claim 18, wherein said fourth, fifth, and sixth CMOS transistors are P-channel transistors.

* * * * *